(12) United States Patent
Herbordt

(10) Patent No.: US 11,879,914 B2
(45) Date of Patent: Jan. 23, 2024

(54) MEASUREMENT APPARATUS AND METHOD FOR CONTROLLING A MEASUREMENT APPARATUS

(71) Applicant: Rohde & Schwarz GmbH & Co. KG, Munich (DE)

(72) Inventor: Wolfgang Herbordt, Ottobrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 446 days.

(21) Appl. No.: 15/816,317

(22) Filed: Nov. 17, 2017

(65) Prior Publication Data

US 2019/0154731 A1 May 23, 2019

(51) Int. Cl.
*G01R 13/02* (2006.01)
*G01R 13/04* (2006.01)

(52) U.S. Cl.
CPC .......... *G01R 13/0254* (2013.01); *G01R 13/04* (2013.01)

(58) Field of Classification Search
CPC ........................... G01R 13/0254; G01R 13/04
See application file for complete search history.

(56) References Cited

U.S. PATENT DOCUMENTS

| | | | | |
|---|---|---|---|---|
| 5,099,440 A * | 3/1992 | Pennebaker | ........ | H03M 7/4006 |
| | | | | 702/181 |
| 6,621,913 B1 * | 9/2003 | de Vries | ................ | G01R 13/32 |
| | | | | 315/392 |
| 2007/0033273 A1 * | 2/2007 | White | ........................ | G06F 8/30 |
| | | | | 709/223 |
| 2007/0261019 A1 * | 11/2007 | Raghavan | ............... | G06F 9/449 |
| | | | | 717/105 |
| 2009/0281748 A1 * | 11/2009 | Cake | ................... | G01R 13/0254 |
| | | | | 702/67 |
| 2011/0137594 A1 * | 6/2011 | Sullivan | ............ | G01R 13/0236 |
| | | | | 702/68 |
| 2012/0041701 A1 * | 2/2012 | Hillman, Jr. | ........... | G01R 23/16 |
| | | | | 702/66 |
| 2015/0293170 A1 * | 10/2015 | Knierim | ................ | G01R 31/28 |
| | | | | 702/124 |
| 2016/0179073 A1 * | 6/2016 | Lehane | .............. | G01R 13/0254 |
| | | | | 326/46 |
| 2017/0168093 A1 * | 6/2017 | Huber | ..................... | G01R 13/34 |
| 2017/0248634 A1 * | 8/2017 | Montijo | ................ | G11C 7/1039 |
| 2018/0372780 A1 * | 12/2018 | Kelly | ..................... | G01R 19/00 |

OTHER PUBLICATIONS

Tektronix, "Triggering Fundameratals", With Pinpoint® Triggering and Event Search & Mark for DPO7000, MSG/DPO/DSA70000 Series Oscilloscopes, www.tektronix.com/oscilloscopes, dated Mar. 2011, 28 pages.

* cited by examiner

*Primary Examiner* — John C Kuan
(74) *Attorney, Agent, or Firm* — Westman, Champlin & Koehler, P.A.

(57) ABSTRACT

A test arrangement and a method for controlling a measurement apparatus are provided. The measurement apparatus, in particular the triggering of the measurement apparatus is controlled by a state machine. If a desired state for triggering the measurement apparatus is not entered within a predetermined time period, the conditions for triggering the measurement apparatus can be adapted. For example, a required state for triggering can be changed or an automated triggering can be initiated.

8 Claims, 5 Drawing Sheets

MEASUREMENT APPARATUS AND METHOD FOR CONTROLLING A MEASUREMENT APPARATUS

TECHNICAL FIELD

The present invention relates to a measurement apparatus. The present invention further relates to a method for controlling a measurement apparatus.

BACKGROUND

Although applicable in principal to any measurement apparatus, the present invention and its underlying problem will be hereinafter described in combination with a measurement operation of an oscilloscope.

The use of measurement systems for analyzing modern electronic systems in many times requires an analysis of a time course of the measuring signal. This analysis may require an evaluation of very fast signals. Hence, it will be necessary to record the measurement of signal and subsequently provide the measured signal to a user. Accordingly, it may be necessary to identify an appropriate point of time for starting the measurement.

For this purpose, a state machine may be used. Upon the state machine changes to a predetermined state, the measurement process may be initiated.

However, in some situations a device under test may not enter the required state for initiating the measurement process. In this case, no measurement will be performed.

Against this background, the problem addressed by the present invention is to provide an enhanced measurement apparatus for a state machine controlled measurement.

SUMMARY

The present invention solves this problem with a measurement apparatus with the features of claim 1 and by a method for controlling a measurement apparatus with the features of claim 10.

Accordingly, in a first aspect a measurement apparatus is provided. The measurement apparatus comprises a state machine, a measurement device and a trigger device. The state machine comprises a number of n states, wherein n is an integer number equal or greater than 2. The measurement device measures a measurement signal. Further, the measurement device may provide measurement data related to the measured signal. The trigger device initiates a data acquisition operation of the measurement device upon a predetermined trigger condition is met. The trigger condition may comprise a condition that the current state of the state machine is a preset trigger state condition. Further, a preset trigger state condition is set to another trigger state condition, if the state machine does not change to the state corresponding to the preset trigger state condition within a predetermined time period.

In a second aspect, a method for controlling a measurement apparatus is provided. The method comprises a step of determining the state of a state machine. The state machine comprises a number of n states, wherein n is an integer number equal or greater than 2. Further, the method comprises the steps of initiating a data acquisition operation of a measurement device upon a predetermined trigger condition is met, wherein the trigger condition may comprise a condition that the current state of the state machine is a preset trigger state condition. Further the method comprises setting the preset trigger state condition to another trigger state condition, if the state machine does not change to a state corresponding to the preset trigger state condition within a predetermined time period.

The present invention is based on the fact that the transition between the individual states of the state machine may depend on many factors. Accordingly, in some cases a state machine of a device under test may not enter a desired state. In such a case, it may be of interest why the state machine does not enter the desired state. However, if a measurement procedure is desired for such a state which will be not entered by the state machine, no automated measurement can be performed.

The present invention however tries to perform an automated measurement of a device under test, even if the state machine will not enter an initially specified state. It is for this purpose that a preset state for triggering the measurement apparatus can be adapted. Hence, even if the initially specified state for triggering the measurement apparatus will be not reached, a measurement can be performed by an automated change of the trigger event, in particular by adapting a condition for the desired state in which a data acquisition of the measurement apparatus is performed.

In this way, a fully automated measurement of a device under test can be performed, even if initially specified state of the state machine cannot be reached. Hence, there is no need for any further manual intervention of a user during the test procedure. Moreover, the measurement apparatus will perform a data acquisition based on a dynamically adapted trigger event, if an initially specified state for triggering the measurement apparatus cannot be reached.

The condition for triggering a data acquisition may comprise at least a specification of a desired condition for a state of the state machine. Hence, the data acquisition may be initiated upon the state machine enters the state specified by the respective trigger state condition. However, it may be also possible to add further requirements for initiating the triggering. As an example, it may be possible to further specify conditions which have to be fulfilled in order to initiate the triggering of a desired operation. For instance, the triggering may be initiated upon a specified signal reaches a desired value, a slope of a signal changes, or any other predefined condition is met. It is further understood, that even more than one condition might be fulfilled or a number of alternative conditions might be defined for triggering a desired operation.

Based on such a data acquisition by an automatically adapted trigger event, it is possible to perform a data acquisition of measurement data of a device under test, and based on the acquired data, it may be possible to evaluate the measurement in order to identify a reason, why a desired state of the state machine has not been reached. In this way, the time period for performing a successful measurement and accordingly for evaluating a device under test can be reduced.

The measurement device of the measurement apparatus may measure any kind of signal, in particular any kind of electrical parameters. For example, the measurement device may measure a voltage, a current, a frequency, a radiation, an electric, magnetic or electromagnetic field, or any other parameters. The measurement device may measure a respective parameter upon a predetermined a trigger event has been identified. In particular, such a trigger event may be a change of the state machine to a predetermined state, in the following denoted as trigger state. Accordingly, the measurement device may perform a single measurement at the point of time of the trigger event. However, it may be also possible that the measurement device may perform a measurement for a period of time. For example, the measurement device may start a measurement of the measurement of the signal upon the trigger event has been identified. For example, the measurement device may measure the measurement of signal with a predetermined sampling rate.

The measurement of the measurement signal may be performed for a predetermined time period or until a predetermined stop event has been identified. For example, the measurement may be performed until a further trigger event is identified. For example, the further trigger event for terminating the measurement may be a change of the state machine to a desired state. However, any other approach for specifying the period of time for measuring of the measurement signal or for terminating the measurement may be possible, too. Accordingly, it may be possible to acquire all or at least part of the measurement data upon the trigger condition is met.

Furthermore, it may be also possible to acquire measurement data even before the desired trigger event for initiating the measurement has been reached. For example, the measurement device may perform a continuous measurement of the measurement signal, and the measured data may be stored in a memory. This memory may be a cyclic memory. In particular, the cyclic memory may have a predetermined memory space. For example, it may be possible to specify the amount of memory, a time period for storing measurement data, a number of measurement samples, or any other parameter relating to the amount of measurement data to be stored. After the stored measurement data are no longer required, the respective measurement data may be overwritten by further, new measurement data. In this case, it may be possible to acquire the measurement data of this memory after the respective trigger event has been identified. In this way, it is possible to obtain measurement data of the measurement a signal even before a point of time when the respective trigger event occurs. However, it is understood that any other method for acquiring a measurement data before or after the trigger event may be also applied.

The predetermined data acquisition operation performed by the measurement device upon the trigger event has been identified, may be, for example, one of the above described operations. However, it is understood, that any other measurement procedure may be initiated when the trigger event, in particular a change to the desired state of the state machine, is detected.

As already mentioned above, it may be possible that the state machine will not enter a desired state. For example, there may be some failures in the device under test, or there may be an error in the programming of the state machine. However, it is understood, that a desired state may be also not reached for any other reason. Accordingly, if a measurement of the measurement apparatus shall be initiated by such a state which will be not reached, no data acquisition may be triggered. Consequently, no measurement data will be acquired. In such a case, the present invention aims to adapt the trigger event. In particular, the desired state for triggering the data acquisition may be adapted. For example, it may be waited for a predetermined period of time, and if the desired state for triggering the data acquisition has not been reached within this period of time, the trigger event, in particular the desired state for triggering the data acquisition may be changed. Hence, by adapting the trigger event, an automated data acquisition of measurement data of the device under test can be performed, even if the originally desired trigger event is not reached. In this way, the measurement apparatus may acquire measurement data related to the device under test which may serve as a basis for analyzing the behavior of the device under test. In particular, it may be possible to identify a reason why the desired state has not been reached by analyzing the acquired a data which are acquired based on the amended trigger event.

Since the trigger event, in particular the desired state for triggering the data acquisition, is amended automatically if the desired state cannot be reached, there is no need for further user interaction. In particular, the data acquisition based on the amended trigger event can be acquired without any manual user interaction and without any amendment or modification of the test setup. Accordingly, time period of the data acquisition procedure can be shortened. Moreover, the data acquisition based of the amended trigger event is automatically performed without any amendment of the test setup. Thus, interference due to modification of the test setup can be avoided.

The state machine and the trigger device may e.g. comprise a general purpose processor with corresponding instructions. Further, the state machine and the trigger device may comprise interfacing elements that are coupled to the processor, receive the measured signals from the test antenna and provide the received signals to the processor. Such interfacing elements may e.g. comprise analog to digital converters that convert the received signals into digital data that may be processed by the processor. Such dedicated digital to analog converters may e.g. be coupled to the processor via a serial or a parallel digital interface. Between the digital to analog converters and an input port analog elements, like e.g. filters comprising resistors, capacitors and inductors, or the like may be provided.

Further embodiments of the present invention are subject of the further subclaims and of the following description, referring to the drawings.

In a possible embodiment, the trigger device is adapted to initiate the predetermined data acquisition of the measurement device, if the state machine does not perform a change to the preset trigger state condition within a predetermined timeout period.

Accordingly, when the desired trigger event, in particular the change of the state machine into the preset trigger state condition will not be reached within a time period which may be specified as a timeout period, it may be possible to change to an automated trigger. In this way, the desired data acquisition procedure is performed after the respective timeout period, irrespective of whether or not the preset trigger state condition is reached. The preset timeout period may be, for example, a fixed, preset time period. However, it may be also possible to adapt the timeout period depending on any kind of parameters. For example, the timeout period may be set up depending on the parameters of a signal of the device under test, a current state of the state machine, or any other parameters related to this the device under test.

In a possible embodiment, the trigger state condition is set to a predetermined initial trigger state condition upon the data acquisition operation of the measurement device has been initiated.

Accordingly, it may be possible to reset the measurement apparatus after performing the data acquisition. The measurement apparatus may automatically perform further data acquisitions, after a previous data acquisition has been finished. In this way, a plurality of successive data acquisitions may be performed, wherein the measurement apparatus is reset to the original configuration of the trigger event after each data acquisition. Accordingly, a number of more than one data acquisition may be performed successively. Thus, it may be possible to acquire multiple data acquisitions automatically. In particular, even if the previous data acquisition has been triggered by an amended trigger state condition, it is possible to perform successive a data acquisition based on another trigger state condition.

In a possible embodiment, the preset trigger state condition is set to another trigger state condition based on a predetermined order of the states of the state machine.

Accordingly, the amendment of the trigger state condition for triggering the data acquisition may be performed in a predetermined order. The order of the amendment for the trigger state conditions may be specified, for instance, by an order of the states which are entered by the state machine during the operation of the device under test. In this way, it may be possible successively adapt the trigger state condition to increase the probability for entering such a trigger state. Thus, a stepwise adaption of the trigger state condition can be performed. It is understood, that any other specification for amending the trigger state condition may be possible, too.

In a possible embodiment, the measurement apparatus comprises an acquisition memory. The acquisition memory is adapted to store measurement data acquired by the measurement device.

The acquisition memory may be any kind of memory, for instance a random access memory (RAM), or non-volatile memory like a flash memory. By storing the acquired data in the acquisition memory, the respective measurement data are available for any further analysis. In particular, the measurement data may be read out by a further processing device. Furthermore, the stored measurement data may be provided to the user, for instance by display.

In a possible embodiment, the measurement apparatus may comprise a state data memory. The state data memory may be adapted to store a history of state data of the state machine.

The state data memory may be any kind of memory, for instance a random access memory (RAM), or non-volatile memory like a flash memory. The history of the state data may relate to any formation related with the states of the state machine and/or any kind of information related to a change of state. However, any other data related to the operation of the state machine may be also stored in the state data memory.

In a possible embodiment, the history of the state data comprises a change of a state of the state machine and a timestamp of a point of time when the state of the state machine changes.

Furthermore, it may be also possible to record any further information related to the operation of the state machine in the state memory. For example, it may be possible to store data related to one or more signals which are analyzed for the operation of the state machine. The information of the state memory may be provided to a further processing device by an appropriate interface or the like. Furthermore, information of the state memory may be provided to the user, for instance by displaying the respective information.

In a possible embodiment, the measurement apparatus comprises a display for displaying the history of the state data.

The history of the state data may be displayed, for instance in a text form by alphanumeric signs, in particular in form of a table. Furthermore, the state data may be also displayed in form of the graph or the like. For example, it may be possible to indicate different states of the state machine by individual graphical symbols, colors, etc. Furthermore, it may be possible to provide the information of the state history in association with the measurement data provided by the measurement device.

In a possible embodiment, the state machine performs a change of a state based on the current state of the state machine and an analysis of a state signal.

The state machine usually analyses input data, for instance an input signal, such as a state signal. Depending on the input signal and the current state of the state machine, the state machine may remain in the current state or may change to another state. For this purpose, the state machine may analyze any kind of properties of the state signal. For instance, the state machine may determine whether or not the state signal exceeds a predetermined threshold value, the state machine may analyze a slope of signal, a shape of the signal, or any other property of a curve form of the signal. Furthermore, the state machine may also analyze any other properties, e.g. frequency. However, it is understood that any other property of the state signal may be also used as a basis for determining a state of the state machine. The state of a signal may be any kind of the signal provided by the device under test. In particular, the state the signal analyzed by the state machine and the measurement of signals measured by the measurement device may be the same signal. However, it may be also possible that the measurement signal measured by the measurement device and the state signal analyzed by the state machine may be different.

Accordingly, the present invention provides a measurement apparatus for performing a measurement which is triggered by a preset trigger state condition of a state machine. In case the preset trigger state condition cannot be reached, the trigger state condition may be adapted in order to achieve an automated triggering of the measurement apparatus.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
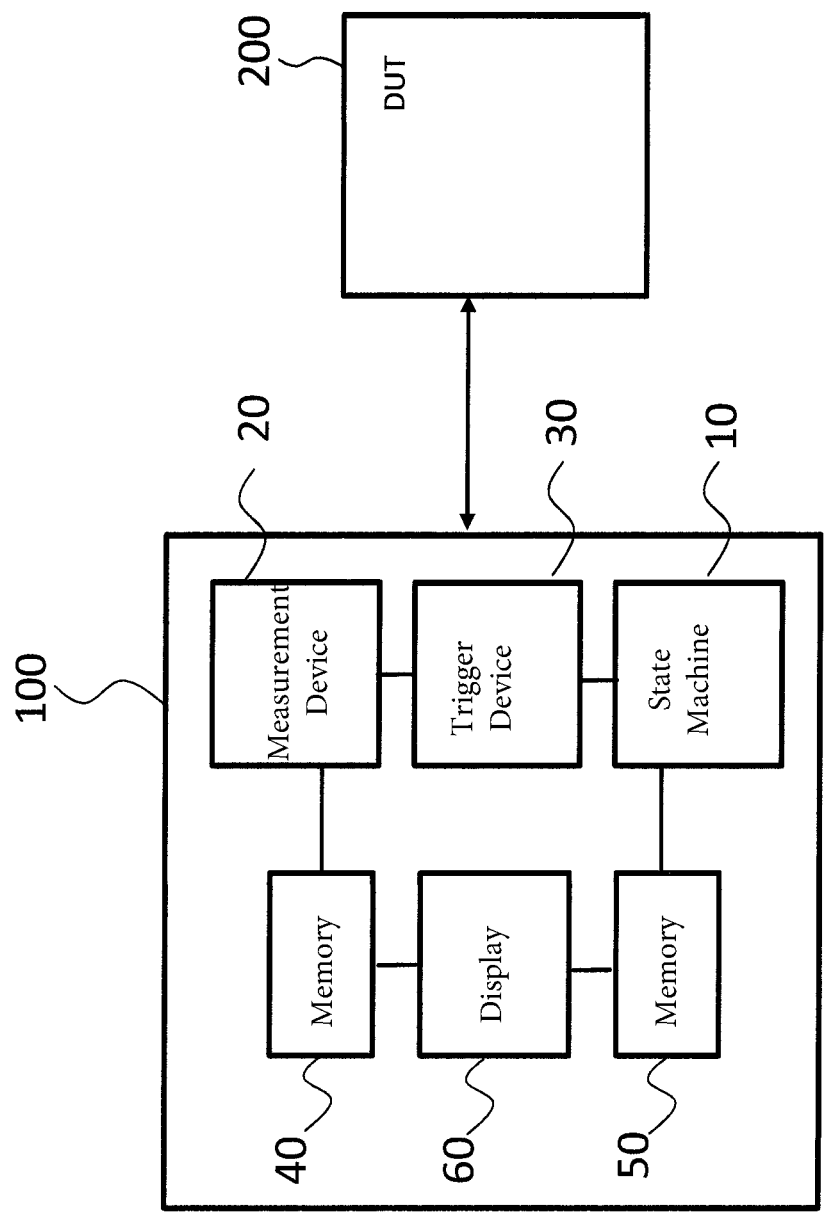
FIG. 1 shows a block diagram of an embodiment of a measurement apparatus according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of an embodiment of a measurement apparatus 100. The measurement apparatus 100 comprises a state machine 10, a measurement device 20 and a trigger device 30. The measurement apparatus 100 may measure a number of one or more signals of a device under test (DUT) 200. For example, measurement device 20 may measure a voltage, a current, an electric, magnetic or electromagnetic field, etc. For this purpose, measurement device 20 may comprise components such as amplifier, filter, analogue to digital converter, etc. accordingly, measurement device 20 may provide measurement data, in particular digital measurement data corresponding to the measured signals.

The state machine 10 of the measurement apparatus 100 may determine its state based on the current state of the state machine 10 and an event, in particular an event of the device under test 200. For example, the state machine 10 may receive a state signal from the device under test 200. Based on the received state signal and the current state of the state machine 10, the state machine 10 may remain in the current state or may change to another state. For this purpose, a set of rules may be defined in the state machine specifying a new state based on the current state and a predetermined event. As already mentioned above, the event for determining the new state of the state machine 10 may be determined based on a state signal received from the device under test 200. In particular, the state signal for determining a new state of the state machine 10 and the measurement signal which is measured by measurement device 20 may be the same signal. However, state machine 10 may also refer to a state signal which is different from the measurement signal measured by measurement device 20.

For example, state machine 10 may determine whether or not the value of the state a signal exceeds a predetermined threshold value. In this case, state machine 10 may enter a first state, if the signal is greater than the predetermined threshold value, and state machine 10 may enter a second state if the signal is not greater than the predetermined threshold value. In this example, the first or the second state may be the same state as the current state of the state machine 10. Separate rules for entering new states may be specified for each state of the state machine 10. However, it is understood, that the analysis of the state signals is not limited to the comparison of the state signal with a predetermined value. It may be also possible to analyze the slope of the state a signal, a waveform of the state signal, the frequency of the state signal, a predetermined change of the signal over the time, or any other property of the state signal.

Trigger device 30 may analyze the current state of the state machine 10 and trigger measurement device 20 upon a predetermined trigger condition is met. The trigger condition may comprise any kind of condition which has to be fulfilled for stating a desired operation such as a data acquisition. In particular, the trigger condition may comprise a trigger state condition which specifies a desired state of the state machine 10. To meet the trigger condition, the current state of the state machine 10 has to be the specified trigger state condition. Further, the trigger condition may comprise any number further conditions which also have to be fulfilled in order to trigger the desired operation, e.g. the data acquisition. Accordingly, measurement device 20 may perform a predetermined measurement operation, e.g. a data acquisition, when receiving a trigger signal from trigger device 30. For example, measurement device 20 may start acquiring measurement data after receiving a trigger signal from trigger device 30. In this case, measurement device 20 may measure a number of one or more measurement signals at a point of time when the trigger signal is received. Furthermore, the number of measurement signals may be measured for a predetermined period of time or a predetermined number of measurement samples may be acquired when receiving the trigger signal. The measurement data corresponding to the measured signal may be stored in an acquisition memory 40. In particular, a timestamp may be stored together with the acquired measurement data.

However, the present invention is not limited into a measurement which is only started upon receiving the trigger signal. Moreover, it may be also possible to acquire measurement data relating to a time period before the timing of the trigger signal. For this purpose, the measurement device 20 may continuously measure the measurement signal and the store the measurement data relating to the measured signal in a memory. For example, a predetermined number of measurement samples may be stored in the memory, or measurement data relating to a predetermined period of time may be stored in the memory. Data relating to measurements which are no longer of interest may be overwritten by newly acquired measurement data. However, any other schema for providing measurement data for a predetermined time period may be possible, too. In this case, the measurement data stored in this memory may be copied to the acquisition memory 40 upon receiving a trigger signal. Accordingly, it is possible to acquire measurement data previous to the trigger signal.

Furthermore, the operation of the state machine 10 may be also recorded in a state data memory 50. For example, state data memory 50 may store data relating to the current state of the state machine 10. Each change of the state of the state machine 10 may be stored in state data memory 50. In particular, a timestamp for each change of the state of state machine 10 may be stored together with the respective state in a state memory 50. However, any further information, in particular any further information relating to the operation of state machine 10 may be also stored in state data memory 50. For example, data relating to the state signal which causes a change of the state of state machine 10 may be also stored in state data memory 50. Furthermore, any kind of measurement data of the state signal and/or the measurement of signal may be also stored in state data memory 50. In this way, it is possible to analyze the operation of the state machine 10 based on the data stored in the state data memory 50.

As already mentioned above, trigger device 30 may provide a trigger signal for causing a predetermined measurement operation. However, in some cases, it may be possible that state machine 10 may not enter a desired state, e.g. a preset trigger state condition, initiating the trigger event.

Figure 2:
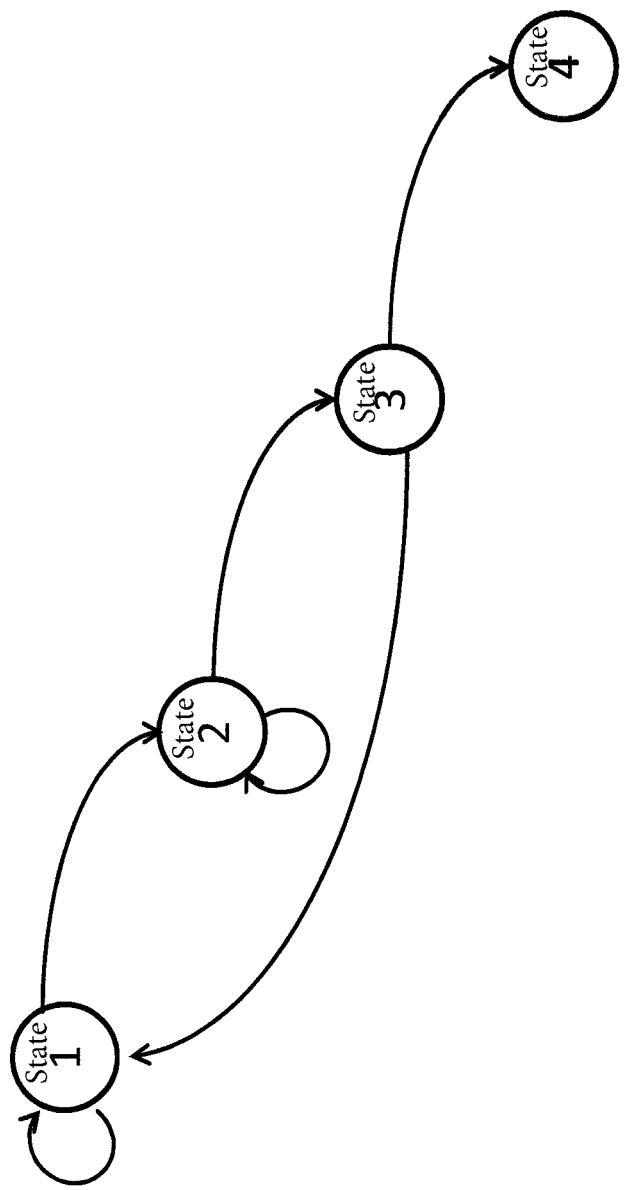
FIG. 2 shows transition diagram of a state machine in a measurement apparatus according to an embodiment.

FIG. 2 schematically illustrates the transition of states in a state machine 10. State machine 10 may start from the first state 1. Depending on a first event, state machine 10 may remain in the first state 1 or may change to a second state 2. After entering the second state 2, state machine 10 may remain in second state 2 or change to a third state 3. In the third state 3, state machine 10 may either return to the first state 1 or change to a fourth state 4. However, it is understood, that the present invention is not limited to a state machine comprising four states. Moreover, any other number of states may be also possible. In this example, the fourth state 4 may relate to the state triggering a predetermined operation, e.g. acquiring measurement data. However, if the fourth state 4 is not reached due to any reason, measurement apparatus 100 will never perform a desired operation.

In such a case, trigger device 30 may adapt the condition for a desired state of the state machine 10 which triggers the measurement operation, e.g. a data acquisition. For example, trigger device 30 may measure a time from a start point of time, and trigger device 30 may set the condition for the trigger state which is to be entered by the state machine 10 for triggering the measurement operation, if the previously set trigger state according to a preciously set condition has not been entered within a predetermined time period. The start point of time may be, for example, the point of time when the measurement apparatus 100 is initialized, or the measurement apparatus 100 is set into the particular data acquisition mode. However, it is understood, that any other point of time may be also used as starting point. For example, the starting point may be a point of time when the state machine 10 changes to particular state or when the signal provided by the device under test 200 changes to the predetermined signal state.

If, as already mentioned above, the preset condition of the trigger state is not entered in a predetermined period of time, the trigger state may be adapted. For example, the condition for the trigger state may be changed to another state of the state machine 10. For example, the condition for the trigger state may be changed to a state which may be expected as a state previous to the current condition of the trigger state. In the example of FIG. 2, the initial condition of the trigger state is the fourth state 4, which is entered from the third state 3 upon detecting a predetermined event. Hence, if the fourth state 4 as the initial condition of the trigger state is not entered within the predetermined period of time, the third state 3 may be set to a new condition of the trigger state. After changing the condition of the trigger state to the new condition of the trigger state, the predetermined operation, e.g. a data acquisition, will be executed upon entering the third state 3. However, if the third state 3 as new condition of the trigger state will also not entered within a predetermined period of time, a further change of the condition of the trigger state may be performed. In the example of FIG. 2, the third state 3 may be entered from the second state 2 upon detecting a predetermined event. Hence, if the third state 3 will not be entered within the predetermined period of time, the condition of the trigger state will be further changed to the second state 2. Finally, a further change to the first state 1 as condition of the trigger state may be performed, if the second state 2 will not be entered within a predetermined period of time. In this example, the condition of the trigger state will be successively adapted to another trigger state based on the order of the states in which the states will be entered in state machine 10. However, any other order or schema for setting another condition of the trigger state may be also possible.

It is understood, that the periods of time for changing the state are not mandatory the same. Furthermore, different periods of time may be used for each change of the condition of the trigger state. For example, the respective period of time may be specified depending on the respective condition of the trigger state. For this purpose, the respective periods of time may be stored in a memory (not shown) of trigger device 30.

Furthermore, it may be also possible to initiate a predetermined operation, e.g. a data acquisition, irrespective of the current state of the state machine 10. For example, a desired operation may be executed if a desired condition of the trigger state is not met within a predetermined timeout period. Accordingly, an automated trigger operation will be executed in any case after the predetermined timeout period. For this purpose, the timeout period may be measured from a starting point when starting the measurement apparatus 100 or setting the measurement apparatus 100 in a predetermined operation mode. However, it may also possible to measure the timeout period from the point of time when the last change of state of the state machine 10 has been performed. Moreover, any other starting point for measuring the timeout period may be also possible.

After measurement data acquisition of another operation has been executed, the respective operation may be stopped. Accordingly, the measured data may be provided to a further processing device (not shown) for analyzing the measurement data. Furthermore, the acquired data may be provided to a user, for example by displaying the acquired data as described in more detail below.

However, it may be also possible to perform a number of more than one data acquisition operations. In this case, the measurement apparatus 100 may be reset for further measurement operations. For example, the condition of the trigger state for initiating the predetermined operation may be set to an initial condition of the trigger state after executing a respective operation. In this way, a successive operation will be started with the initial parameters, in particular with the initial condition of the trigger state, even if the condition of the trigger state has been amended during the previous operation.

Figure 3:
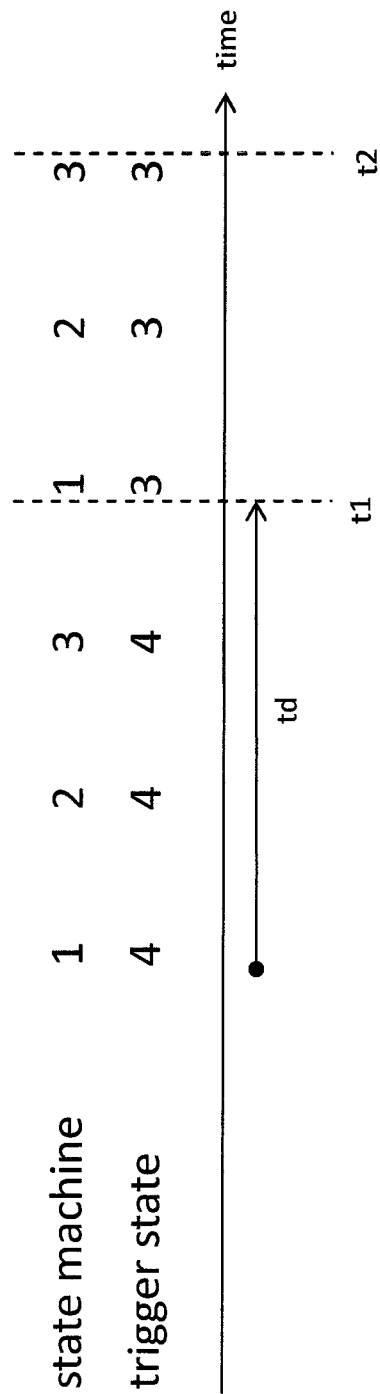
FIG. 3 shows a timing diagram of a measurement apparatus according to an embodiment.

FIG. 3 shows a timing diagram of a data acquisition operation according to an embodiment. In the first row, the states of the state machine 10 are shown. In the second row below, the condition of the trigger state is shown. As can be seen, after a period of time dt, at time t1, the condition of the trigger state is changed from the fourth state 4 to the third state 3. At time t2 the state of state machine 10 changes from the second state 2 to the third state 3, which is the current condition of the trigger state at this point of time. Hence, upon the condition for triggering the data acquisition is met, and the respective operation is started.

Figure 4:
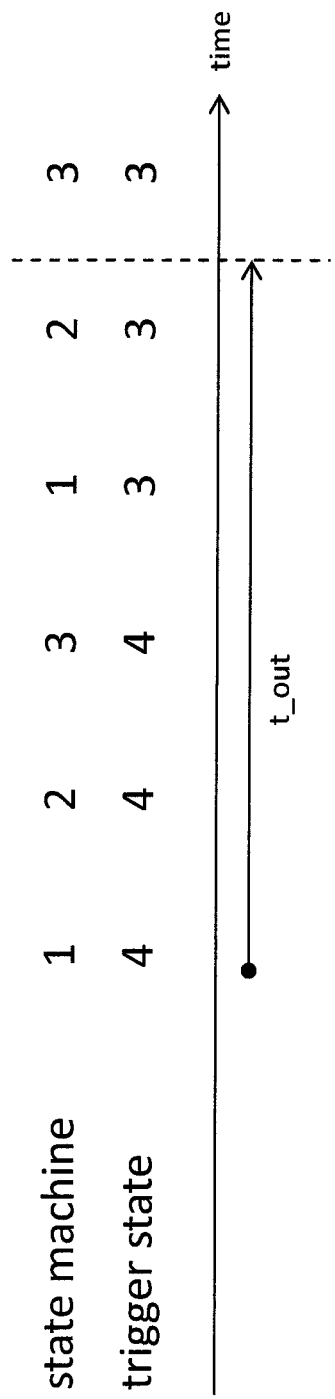
FIG. 4 shows another timing diagram of a measurement apparatus according to an embodiment.

FIG. 4 shows a timing diagram of another measurement operation according to an embodiment. The first row, the states of the state machine 10 are shown. In the second row below, the condition of the trigger state is shown. As can be seen in this example, the state machine 10 does not change to the desired state according to the condition of the trigger state during the timeout period t_out. Hence, the data acquisition operation is executed at t_out irrespective of the current state of the state machine 10.

In order to facilitate evaluating the acquired data of the device under test 200, the information relating to the state machine may be provided. For this purpose, the information of the state machine 10, in particular, the state data stored in state memory 50 may be provided to a processing device (not shown) for further analysis. Furthermore, the data of the state machine 10 and/or the state data stored in state memory 50 may be provided to the user, for instance by means of a display 60 of the measurement apparatus 100.

For example, the state information of state machine 10 may be provided to the user. The state information may be provided in any appropriate manner. For instance, a display or at least an area of the display may change its color depending on a current state. Further, symbols, characters or numbers corresponding respective states of state machine 10 may be displayed. However, any other appropriate manner for indicating information about the state machine 10 may be also possible. For example, the information relating to the state machine 10 may be provided by a graph, a timeline, a table, etc. In particular, the information of the state machine 10 may be provided in text form, for instance in a descriptive manner, by a graph, or the like. It is also possible that the transition of the states are listed together with a timestamp of the respective transition, or any further information relating to the transition of the states, for example information about the state signals causing the transition of the states.

Furthermore, the information about the transition of the states may be provided together with the corresponding acquired measurement data of the measurement signal. For example, the measurement signal may be provided as a graph, for instance on an oscilloscope. In this case, the respective point of times when transition from one state to another is performed may be indicated in this graph. For example, an appropriate indication like a symbol, a character or a number relating to the state of state machine 10 may be displayed at a position of the displayed measurement data. However, any other appropriate manner for indicating the state of the state machine 10 in combination with the measurement data may be also possible.

The providing of the data related to the state machine 10 and/or the acquired measurement data measured by measurement device 20 are not limited to only displaying the information in a fixed manner. Moreover, any kind of navigation through the available data may be possible. For instance, it may be possible to perform any kind of search operation for a desired feature, e.g. the transition from one state to another, remaining in a predetermined state for specified time period, a particular feature of the measured signal, e.g. slope, waveform, etc. Furthermore, the acquired data may be provided in any appropriate manner, as described above, any user may navigate through the provided data. For example, the user may scroll through the provided data, zoom in or out the displayed data or perform any other manipulation or navigation through the data.

Additionally, it may be also possible to adapt the rules of the state machine 10 for entering states. For example, the rules may be provided to the state machine 10 by an interface, or may be amended by a user input. Accordingly, the measurement procedure, in particular the triggering of the data acquisition based on the state of the state machine can be adapted by modifying the rules of the state machine 10. For example, the rules may be provided as a machine language description, a table specifying the states and the corresponding properties of state a signal for entering a new state, or any other appropriate manner for specifying the rules of the state machine.

For sake of clarity in the following description of the method based FIG. 5 the reference signs used above in the description of apparatus based FIGS. 1-4 will be maintained.

Figure 5:
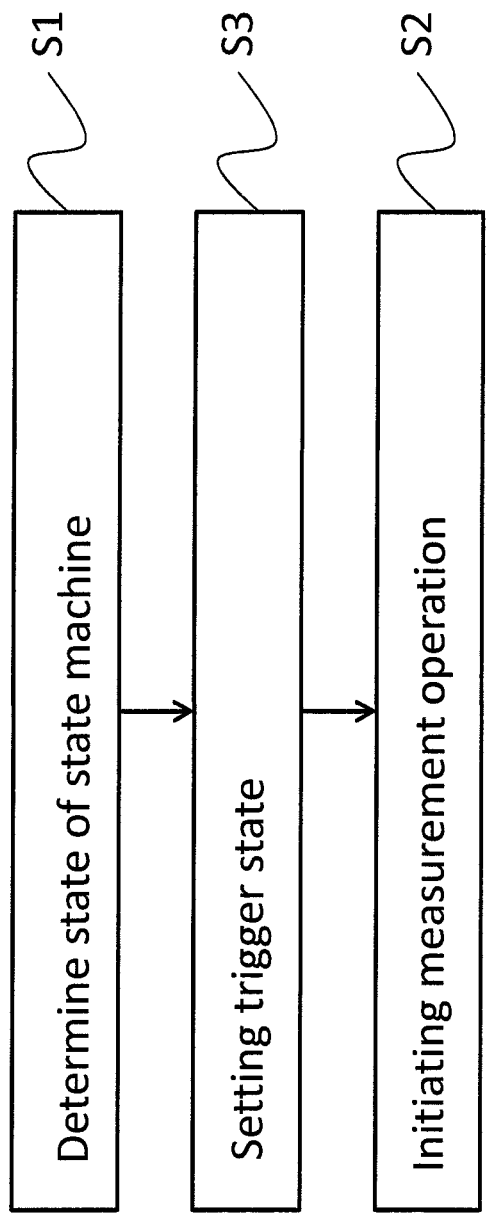
FIG. 5 shows a flow diagram of an embodiment of a method for controlling a measurement apparatus according to the present invention.

FIG. 5 shows a flow diagram of a method for controlling a measurement apparatus such as the above are described measurement apparatus 100.

The method comprises determining S1 the state of a state machine 10. The state machine may comprise a number of n states, wherein n is an integer number equal or greater than 2. The method further comprises initiating S2 a data acquisition operation of a measurement device 20 upon a predetermined trigger condition is met, wherein the predetermined trigger condition comprises that the current state of the state machine is a preset trigger state condition. Further, the method comprises setting S3 the preset trigger state condition to another trigger state condition, if the state machine 10 does not change to the preset trigger state condition within a predetermined time period.

The data acquisition operation of the measurement device 20 may be performed, if the state machine 10 does not perform a change to the preset trigger state condition for a predetermined timeout period.

The method may further comprise setting the trigger state condition to a predetermined initial trigger state condition upon the data acquisition operation of the measurement device 20 has been initiated.

The preset trigger state condition may be set to another trigger state condition based on a predetermined order of the states of the state machine 10.

The method may further comprise storing acquired measurement data provided by the measurement device 20 in an acquisition memory 40.

The method may further comprise storing a history of state data of the state machine 10 in a state data memory 50.

The history of the state data may comprises a change of a state of the state machine 10 and a timestamp of a point of time when the state of the state machine 10 changes.

The method may further comprise displaying the history of the state data on a display 60.

The method may further comprise changing a state of the state machine 10 based on the current state of the state machine the 10 and an analysis of a state signal.

Summarizing, the present invention relates to a measurement apparatus and a method for controlling a measurement apparatus, wherein the measurement apparatus, in particular the triggering of the measurement apparatus is controlled by a state machine. If a desired state for triggering the measurement apparatus is not entered within a predetermined time period, the conditions for triggering the measurement apparatus may be adapted. For example, a desired state for triggering can be changed or an automated triggering can be initiated.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 10 state machine
20 measurement device
30 trigger device
40 acquisition memory
50 state data memory
60 display
100 measurement apparatus
200 device under test

The invention claimed is:

1. A measurement apparatus, comprising:
a state machine with a number of n states, wherein n is an integer number equal or greater than 2, wherein the state machine is configured to receive a signal from a device under test, and the state machine is further configured to set a new state of the state machine based on a current state of the state machine and the signal received from the device under test when the state machine receives the signal from the device under test;
a measurement device for measuring a measurement signal and providing measurement data related to the measurement signal;
an acquisition memory adapted to store the measurement data acquired by the measurement device; and
a trigger device for initiating a data acquisition operation of the measurement data upon a predetermined trigger condition being met,
wherein the predetermined trigger condition comprises that the current state of the state machine is in a preset trigger state condition which specifies a desired state of the state machine and at least one further condition of a signal for initiating a trigger event is met,
wherein, if the predetermined trigger condition has not been reached within a predetermined period of time, the trigger device is configured to amend the preset trigger state condition to another trigger state condition which specifies another desired state of the state machine based on a predetermined order of the states of the state machine,
wherein the predetermined period of time is measured from a point in time when the measurement apparatus is set to a data acquisition mode or the device under test changes to a predetermined signal state,
wherein, if the another trigger state condition has not been reached within a timeout period, the trigger device is adapted to initiate the data acquisition operation, and
wherein the measurement apparatus further comprises a state data memory adapted to store a history of state data including a change of a state of the state machine and a time stamp of a point of time when the state of the state machine changes.

2. The measurement apparatus according to claim 1, wherein the trigger state condition is set to a predetermined initial trigger state condition upon the data acquisition operation having been initiated.

3. The measurement apparatus according to claim 1, comprising a display for displaying the history of the state data.

4. The measurement apparatus according to claim 1, wherein the state machine performs a change of a state based on the current state of the state machine and an analysis of a state signal.

5. A method for controlling a measurement apparatus, comprising the steps of:
determining, by a trigger device, a state of a state machine, the state machine comprising a number of n states, wherein n is an integer number equal or greater than 2, wherein a new state of the state machine is set based on a current state of the state machine and a signal received from a device under test when the state machine receives the signal from the device under test;
initiating, by the trigger device, a data acquisition operation of measurement data measured by a measurement device upon a predetermined trigger condition being met, wherein the predetermined trigger condition comprises that the current state of the state machine is in a preset trigger state condition which specifies a desired state of the state machine and at least one further condition of a signal for initiating a trigger event is met;
storing, by a state data memory, a history of state data of the state machine;
if the predetermined trigger condition has not been reached within a predetermined period of time, amending, by the trigger device, the preset trigger state condition to another trigger state condition which specifies another desired state of the state machine based on a predetermined order of the states of the state machine,
wherein the predetermined period of time is measured from a point in time when the measurement apparatus is set to a data acquisition mode or the device under test changes to a predetermined signal state, and
if the another trigger state condition has not been reached within a timeout period, initiating, by the trigger device, the data acquisition operation of the measurement data measured by the measurement device; and
storing, by a state data memory, a history of state data including a change of a state of the state machine and a time stamp of a point of time when the state of the state machine changes.

6. The method according to claim 5, comprising setting the trigger state condition to a predetermined initial trigger state condition upon the data acquisition operation of the measurement device having been initiated.

7. The method according to claim 5, comprising displaying the history of the state data on a display.

8. The method according to claim 5, comprising changing a state of the state machine based on the current state of the state machine and an analysis of a state signal.

* * * * *